Figure 1:
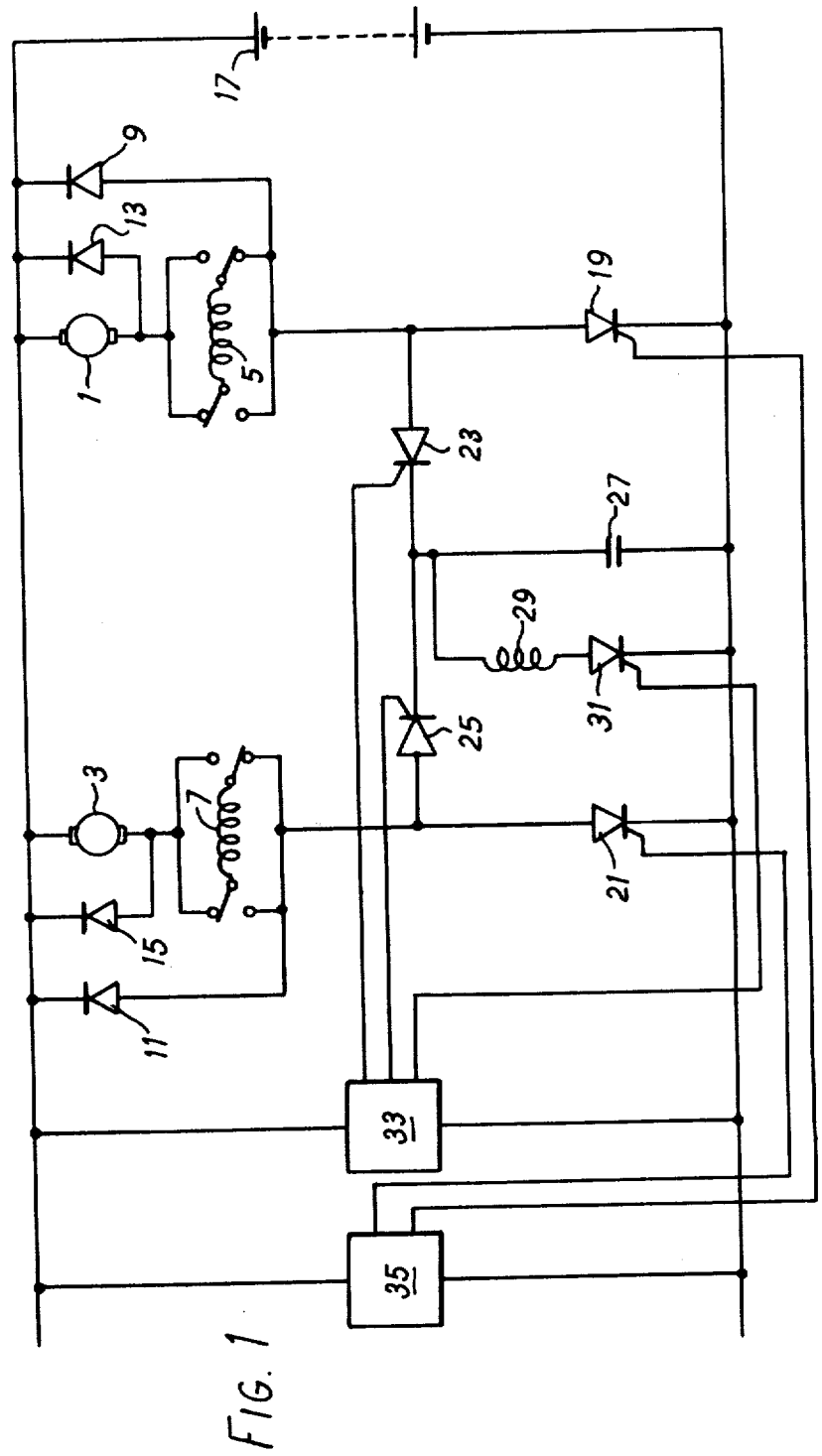

United States Patent

Gurwicz et al.

[11] 4,054,817
[45] Oct. 18, 1977

[54] PULSE CONTROLLERS

[75] Inventors: David Gurwicz; Albert Everett Sloan, both of Gateshead, England

[73] Assignee: Sevcon Limited, Gateshead, England

[21] Appl. No.: 674,129

[22] Filed: Apr. 6, 1976

[30] Foreign Application Priority Data

Apr. 8, 1975 United Kingdom ............... 14361/75

[51] Int. Cl.² .............................................. H03K 3/00
[52] U.S. Cl. ...................................... 318/82; 318/112; 318/139; 318/345 G
[58] Field of Search .................... 318/80, 112, 345 G, 318/139, 82

[56] References Cited

U.S. PATENT DOCUMENTS

| 3,492,557 | 1/1970 | Brown | 318/345 G |
| 3,648,151 | 3/1972 | Gurwicz | 318/345 G |
| 3,751,677 | 8/1973 | Gurwicz | 318/345 G |

Primary Examiner—B. Dobeck
Attorney, Agent, or Firm—Alfred H. Rosen; Frank A. Steinhilper

[57] ABSTRACT

A thyristor pulse controller in which current supply to each of a plurality of d.c. loads is controlled by respective main thyristors and a single commutating capacitor common to all the main thyristors is provided, the capacitor being connected across the main thyristors to commutate them one at a time at intervals not less than the time required to forward charge the commutating capacitor from the d.c. source and to reverse the charge on the capacitor.

5 Claims, 2 Drawing Figures

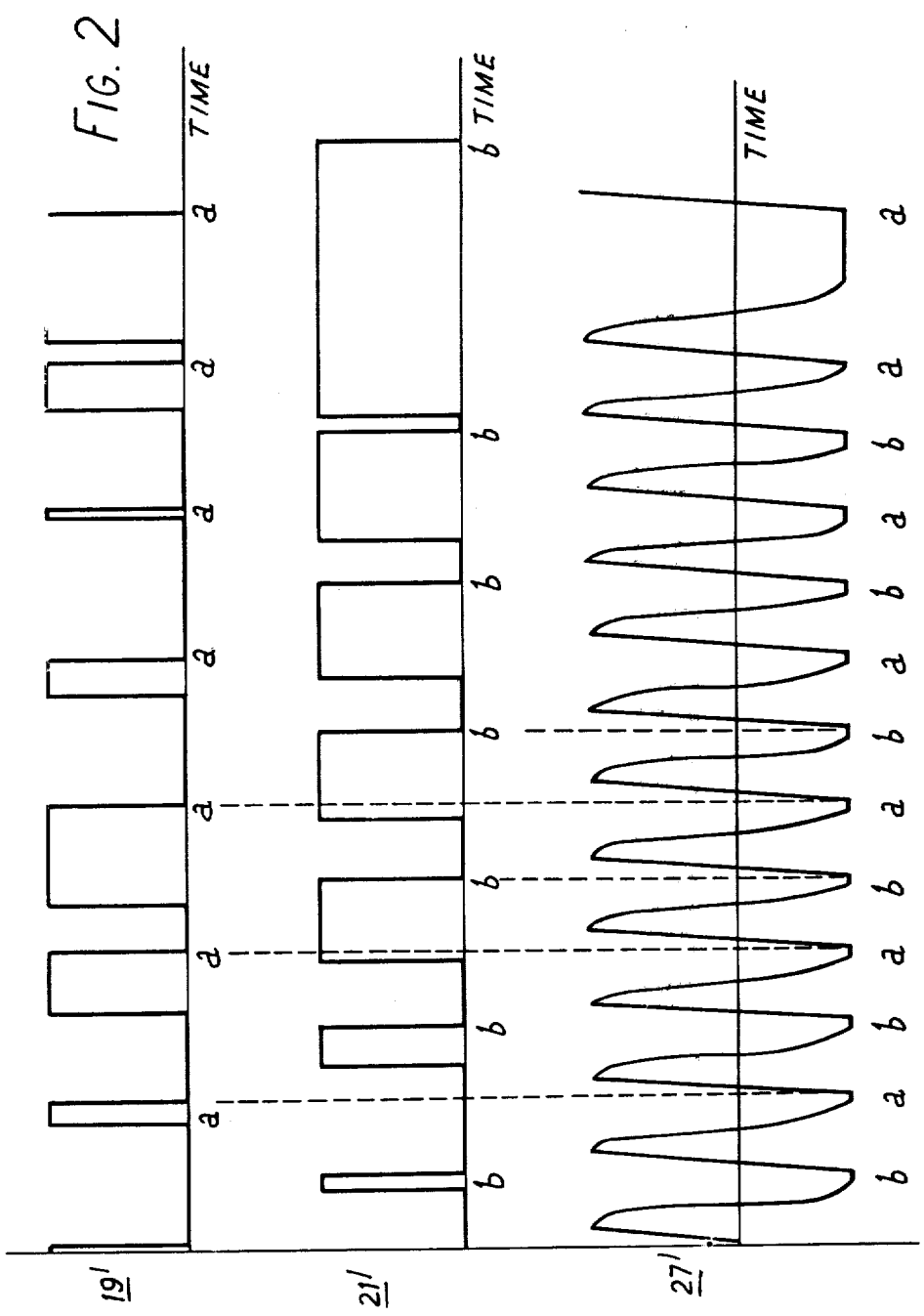

PULSE CONTROLLERS

This invention relates to pulse controllers and, more particularly, to pulse controllers for controlling the mean current supply to each of a plurality of d.c. loads. Pulse controllers of the kind referred to are widely used, especially in the field of d.c. motor control, for example, in the control of traction motors of industrial, battery driven vehicles.

It has previously been proposed to control two motors driving the driving wheels of an industrial vehicle by a common controller in which the mean current to the individual motors was controlled by controlling the initiation of conduction of main thyristors in series with the respective motors and the vehicle battery and simultaneously commutating the main thyristors. This meant that the commutating capacitor of the common controller, which employed capacitor turn off of the main thyristors, had to be capable of handling all the motor currents simultaneously.

As commutating capacitors are manufactured from petroleum derived products, capacitor prices have, with the recent immense increase in the price of crude oil, risen to exceptionally high levels. Accordingly, the use of high capacitance capacitors for commutation is becoming uneconomic.

It is an object of the present invention to provide a pulse controller for controlling the mean current supplied to each of a plurality of d.c. loads which is capable of using a commutating capacitor of relatively low capacitance compared with that employed in the known from of pulse controller referred to.

The present invention consists in a pulse controller for controlling the mean current supplied to each of a plurality of d.c. loads, comprising a plurality of main thyristors for connection in series between respective loads and a d.c. source, a common commutating capacitor, a plurality of commutating thyristors connected with respective main thyristors and each connected to the commutating capacitor to form with the capacitor a shunt across the corresponding main thyristor so that firing of the commutating thyristor effects commutation of the corresponding main thyristor and subsequent forward charging of the commutating capacitor from the d.c. source, means for reversing the charge on the commutating capacitor after it has been forward charged, and control circuit means for controlling firing into conduction of the thyristors so that conduction of the commutating thyristors occurs one at a time at intervals not less than the time required, from the commencement of commutation of any main thyristor, to effect forward charging of the commutating capacitor and reversal of the forward charge on the commutating capacitor.

It will be apparent that the present invention requires commutation of the main thyristors individually at minimum time intervals so that the commutating capacitor requires only to be able to commutate the maximum current through any one of the main thyristors and the capacitor can, accordingly, be dimensioned to have capacitance considerably less than required to commutate the total current carried by all the main thyristors.

The controller according to the invention employs a time sharing approach in which the commutation capacitor is never called upon to commutate more than one main thyristor at a time.

The invention will now be described, by way of example, with reference to the accompanying drawings, in which:

FIG. 1 is a circuit diagram of the principal parts of a pulse controller according to the invention, and FIG. 2 shows graphs illustrating the variation with time of the current through the main thyristors and the voltage across the commutating capacitor of the pulse controller of FIG. 1.

Referring first of FIG. 1, a pulse controller for a battery driven vehicle, is employed to control the mean current through d.c. series traction motors 1 and 3 having respective field windings 5 and 7 provided in known manner with reversal contactors. The motors are further provided in known manner with respective free wheel diodes 9 and 11 for maintaining current flow through the motor during inter-pulse periods and with respective armature or "plugging" diodes 13 and 15 which serve during plugging of the motor to limit the armature-generated e.m.f. In series with the motors 1 and 3 and a battery 17 of the vehicle are respective main thyristors 19 and 21. The anodes of main thyristors 19 and 21 are connected with the anodes of respective commutating thyristors 23 and 25. The cathodes of thyristors 23 and 25 connect with one plate of commutating capacitor 27, the other plate of which is connected to battery negative. The commutating capacitor 27 together with one of the commutating thyristors 23 and 25 thus forms a shunt across the corresponding main thyristor 19 or 21.

Shunting the commutating capacitor 27 is a charge reversal circuit consisting of an inductor 29 in series with a reversal thyristor 31.

Control circuits 33 and 35 are provided for controlling the firing of the thyristors. Control circuit 33 supplies firing pulses to the gates of commutating thyristors 23 and 25 alternately at equal intervals of time (shown by points $a$ and $b$ in FIG. 2, as described below). The circuit also supplies a firing pulse to the reversal thyristor 31 at a predetermoned interval after firing of one of the commutating thyristors, the interval being sufficient to allow the commutating capacitor 27 to be fully forward charged. As will be apparent to those skilled in the art, any suitable conventional circuitry may be used in control circuit 33 to provide firing pulses in the appropriate sequence. Control circuit 35 provides firing pulses to the gates of main thyristors 19 and 21, the firing pulse to each main thyristor being supplied at an instant delayed from the last commutation of the main thyristor by an interval which is variable in dependence on an input to the control circuit, e.g. from circuitry connected to the accelerator pedal and steering mechanism of a vehicle whose left-hand and right-hand traction wheels are driven respectively by the motors 1 and 3. Suitable forms of circuitry will be apparent to those skilled in the art.

In operation of the controller, assume that main thyristor 19 is conducting load current and that the lower plate of capacitor 27 is positive with respect to the upper plate thereof, the capacitor having enough charge to effect commutation of either main thyristor. If now commutation thyristor 23 is rendered conducting, main thyristor 19 is reverse biassed and, accordingly, commutated and capacitor 27 forward charges from the battery via the motor armature 1 and field windings 5. When the capacitor is fully charged the current through thyristor 23 falls below the hold value of that thyristor which is, accordingly, turned off. Thyristor 31 is now fired to effect reversal of the charge on capacitor 27 so that the lower plate of the capacitor becomes positively charged with respect to its upper plate. The capacitor 27 is once again now available to commutate either of thyristors 19 or 21. If it is now desired to commutate thyristor 21, the commutation thyristor 25 is fired into conduction. Capacitor 27, accordingly, reverse biasses thyristor 21 and is discharged and subsequently forward charged via motor armature 3, field winding 7 and commutating thyristor 25. When capacitor 27 is fully charged in the forward direction the current through thyristor 25 falls to below its hold value and that thyristor commutates. Reversal thyristor 31 is then fired to reverse the charge on capacitor 27. When this has taken place capacitor 27 is available for commutation once again.

In FIG. 2, graphs 19' and 21' show the variation with time of the current flowing through the main thyristors 19 and 21 respectively, and graph 27' shows the variation with time of the voltage across the commutating capacitor 27. It will be seen that commutation of main thyristor 19 (effected by firing thyristor 23) occurs at equally spaced instants marked $a$, whilst commutation of main thyristor 21 (effected by firing thyristor 25) occurs at equally spaced instants $b$, the intervals $a$—$a$ being equal to the intervals $b$—$b$. It will be appreciated that the minimum interval between successive commutations of the two main thyristors has to be such that the commutating capacitor 27 can become fully forward charged, i.e. with its top plate positive relative to its bottom plate, and subsequently fully reverse charged in consequence of firing thyristor 31.

The main thyristor 19 can be fired at any time in the period $a$—$a$, after sufficient time has elapsed after commutation to allow the commutating capacitor to be discharged and fully forward charged from the battery, so that by varying the times of firing of thyristor 19 the mean voltage applied to motor 1 can be varied by pulse-width modulation. Similarly, main thyristor 21 can be fired at any time in the period $b$—$b$, after sufficient time from the start of the period to allow forward charging of the capacitor, so that the mean voltage applied to motor 3 can be varied by pulse-width modulation independently of motor 1.

The pulse frequency of current supplied to each of motors 1 and 3 is the same and equal to the inverse of the period $a$—$a$ or $b$—$b$. The pulse frequency can thus be varied by varying the length of that period. The mean voltage applied to the motors can therefore be varied by pulse frequency control or by a mixture of pulse width and pulse frequency control.

Whilst the embodiment of the invention which has been described in concerned with two motors, the invention could equally be applied to several motors, the number of which can be odd or even. Each motor would perform different functions with the proviso that the capacitor must be capable of commutating the largest current associated with the largest motor.

The invention is also applicable to the control of main current through two or more d.c. loads other than d.c. motors.

We claim:

1. A pulse controller for controlling the mean current supplied to each of a plurality of d.c. loads, comprising a plurality of main thyristors for connection in series between respective loads and a d.c. source, a common commutating capacitor, a plurality of commutating thyristors connected with respective main thyristors and each connected to the commutating capacitor to form with the capacitor a shunt across the corresponding main thyristor so that firing of the commutating thyristor effects commutation of the corresponding main thyristor and subsequent forward charging of the commutating capacitor from the d.c. source, means for reversing the charge on the commutating capacitor after it has been forward charged thereby to put the capacitor in condition to commutate any one of the main thyristors on firing of the corresponding commutating thyristor, and control circuit means for controlling firing into conduction of the thyristors so that conduction of the commutating thyristors occurs one at a time at intervals not less than the time required, from the commencement of commutation of any main thyristor, to effect forward charging of the commutating capacitor and reversal of the forward charge on the commutating capacitor.

2. A pulse controller as claimed in claim 1, in which the means for reversing the charge on the commutating capacitor comprises a further thyristor connected in series with an inductor across the commutating capacitor.

3. A pulse controller as claimed in claim 1, in which the control circuit means is adapted to fire the commutating thyristors one at a time at intervals of constant length.

4. A pulse controller as claimed in claim 3, in which the control circuit means includes means for selectively varying the instant of firing of each main thyristor within the period between successive commutations of that thyristor, thereby to vary the pulse-width of current supplied to the load in series with that thyristor.

5. An industrial vehicle having two d.c. electric motors driving its driving wheels and provided with a pulse controller as claimed in claim 1 for controlling the mean current supply to each of said motors.

* * * * *